United States Patent
Shih et al.

(10) Patent No.: US 12,185,068 B2
(45) Date of Patent: Dec. 31, 2024

(54) ADAPTIVE EQUALIZATION METHOD AND SYSTEM FOR ACOUSTIC SYSTEM

(71) Applicant: HARMAN INTERNATIONAL INDUSTRIES, INCORPORATED, Stamford, CT (US)

(72) Inventors: Shao-Fu Shih, San Jose, CA (US); Jianwen Zheng, Shenzhen (CN)

(73) Assignee: Harman International Industries, Incorporated, Stamford, CT (US)

( * ) Notice: Subject to any disclaimer, the term of this patent is extended or adjusted under 35 U.S.C. 154(b) by 174 days.

(21) Appl. No.: 17/871,779

(22) Filed: Jul. 22, 2022

(65) Prior Publication Data

US 2023/0033662 A1   Feb. 2, 2023

(30) Foreign Application Priority Data

Jul. 28, 2021 (CN) .......................... 202110857951.0

(51) Int. Cl.
   *H04R 3/04* (2006.01)
(52) U.S. Cl.
   CPC ..................... *H04R 3/04* (2013.01)

(58) Field of Classification Search
   CPC ....................................................... H04R 3/04
   USPC .......................................................... 381/98
   See application file for complete search history.

(56) References Cited

U.S. PATENT DOCUMENTS

| | | | |
|---|---|---|---|
| 9,686,608 B2 * | 6/2017 | Macours | H04R 3/02 |
| 2017/0230024 A1 | 8/2017 | Lu et al. | |
| 2018/0115824 A1 * | 4/2018 | Cassidy | H04R 3/007 |

FOREIGN PATENT DOCUMENTS

| | | | | |
|---|---|---|---|---|
| CN | 112384976 A * | 2/2021 | | G10L 21/028 |
| WO | WO-2020205090 A1 * | 10/2020 | | G10L 21/0232 |

* cited by examiner

*Primary Examiner* — Sean H Nguyen
(74) *Attorney, Agent, or Firm* — Artegis Law Group, LLP (57) ABSTRACT

The present disclosure provides an adaptive equalization method and system for an audio system. The method includes: detecting an input signal and estimating signal energy of the input signal; determining an audio signal status based on the estimated signal energy; performing dynamic gain calculation based on the estimated signal energy and the audio signal status; and using the calculated gain to adjust equalization parameters, thereby performing dynamic equalization processing on the input signal.

18 Claims, 8 Drawing Sheets

ADAPTIVE EQUALIZATION METHOD AND SYSTEM FOR ACOUSTIC SYSTEM

CROSS-REFERENCE TO RELATED APPLICATIONS

This application claims the priority benefit 202110857951.0, filed on Jul. 28, 2021, titled "ADAPTIVE EQUALIZATION METHOD AND SYSTEM FOR ACOUSTIC SYSTEM." The subject matter of this application is incorporated by reference herein in its entirety.

BACKGROUND

Field of the Various Embodiments

The present disclosure generally relates to the field of acoustic systems, and more particularly, to a dynamic energy-based adaptive equalization method and system for an acoustic system.

Description of the Related Art

Usually, a typical acoustic system involves two parts: an electrical design and a transducer part. The electrical design is used for an input signal. Then, the input signal is amplified for use in a transducer by means of a bipolar junction transistor or metal-oxide-semiconductor field effect transistor technology, thereby converting an electrical signal into a physical air vibration by means of electromagnetic conversion. For good audio quality, the system needs to achieve a flat acoustic response between 20 Hz and 20 kHz. A common method is to achieve this point by means of filter designs, which may be achieved by means of analog passive designs (for example, RLC circuits) or digital signal filters (for example, FIR and IIR designs). Usually, a flat response may be achieved by applying measurement technologies and design iterations in component selection and filter design.

At present, the commonly used method in loudspeaker products is to adopt a dynamic range compressor (DRC) or a limiter. It may be used to significantly improve a low frequency response of an input signal, thereby improving the bass performance of loudspeakers without introducing distortion. In existing methods of using a DRC, an input signal is usually processed after equalization, and then output after passing through the DRC. In this method, equalization (EQ) is fixed, i.e., the input signals are filtered using exactly the same equalizer parameters regardless of signal energy. Since this fixed EQ cannot be adaptively adjusted, engineers can only pre-set a set of EQ parameters for high-signal energy and low-signal energy scenarios, which obviously limits engineer's tuning flexibility and limits the performance of loudspeakers.

In order to further enhance the bass performance of loudspeakers, one solution is to apply a plurality of compression ratios in the DRC. Although this solution can achieve a better sound performance at a low signal level, it still lacks flexibility for the desired center frequency that engineers are concerned with. Moreover, a dynamic range thereof is compressed from the fixed EQ, which still has limitations.

Therefore, there is a need for an improved technical solution to overcome the limitations of conventional loudspeaker tuning processes using fixed digital filter designs in existing solutions.

SUMMARY

According to an aspect of the present disclosure, an adaptive equalization method for an audio system is provided. The method may include: detecting an input signal and estimating signal energy of the input signal; determining an audio signal status based on the estimated signal energy; performing dynamic gain calculation based on the estimated signal energy and the audio signal status; and using the calculated dynamic gain to adjust equalization parameters, thereby performing dynamic equalization processing on the input signal.

According to one or more embodiments, the determining an audio signal status based on the estimated signal energy may further include: continuously detecting the estimated signal energy for each frame of input signal; and comparing the estimated signal energy with an energy threshold. If the estimated signal energy is greater than or equal to the energy threshold, the audio signal status is determined to be audio signal being played. If the estimated signal energy is less than the energy threshold, a timer is started. If it is detected again that the estimated signal energy is greater than or equal to the energy threshold before the timer expires, the audio signal status is determined to be audio signal being played; otherwise, the audio signal status is determined to be audio signal already been paused.

According to one or more embodiments, the performing dynamic gain calculation based on the estimated signal energy and the audio signal status may further include: if the audio signal status is determined to be audio signal being played, performing the dynamic gain calculation. If the audio signal status is determined to be audio signal already been paused, the dynamic gain calculation is not performed, and when it is detected that playing of the audio signal starts, parameters used for the dynamic gain calculation are initialized.

According to one or more embodiments, the performing dynamic gain calculation may further include: calculating a signal energy difference between the estimated signal energy and target energy; and determining whether the signal energy difference falls within an adjustment range. If the signal energy difference falls within the adjustment range, the signal energy difference is smoothed. If the signal energy difference does not fall within the adjustment range, the signal energy difference is first limited, and then the limited signal energy difference is smoothed. Moreover, the dynamic gain is calculated based on the smoothed signal energy difference.

According to one or more embodiments, the method further includes smoothing the calculated dynamic gain.

According to one or more embodiments, the method may further include: performing frequency division filtering on the input signal before estimating the signal energy of the input signal.

According to one or more embodiments, the method may further include: performing weighted summation processing of the smoothed dynamic gain according to different frequency ranges, wherein weights used for the weighted summation processing are set according to the different frequency ranges.

According to one or more embodiments, the method further includes: calculating gain factors for equalization of different bands based on the dynamic gain after the weighted summation processing, thereby performing dynamic equalization processing on the input signal.

According to one or more embodiments, calculating the gain factors includes: calculating the gain factors using gain functions corresponding to different bands.

According to another aspect of the present disclosure, an adaptive equalization system for a system is provided, which includes: a memory and a processor. The memory is configured to store computer-executable instructions. The processor is configured to execute the instructions to implement the method described above.

BRIEF DESCRIPTION OF THE DRAWINGS

The present disclosure can be better understood by reading the following description of non-limiting implementations with reference to the accompanying drawings, in which.

DETAILED DESCRIPTION

It should be understood that the following description of the embodiments is given for illustrative purposes only, and not restrictive. The division of examples in functional blocks, modules, or units shown in the drawings should not be construed as representing that these functional blocks, modules or units must be implemented as physically separated units. The functional blocks, modules or units shown or described may be implemented as separate units, circuits, chips, functional blocks, modules, or circuit elements. One or more functional blocks or units may also be implemented in a common circuit, chip, circuit element, or unit.

The use of singular terms (for example but not limited to, "a") is not intended to limit the number of items. The use of relational terms, for example but not limited to "top," "bottom," "left," "right," "upper," "lower," "downward," "upward," "side," "first," "second" ("third," etc.), "entry," "exit," etc., are used in the written description for clarity in specific reference to the drawings and are not intended to limit the scope of the present disclosure or the appended claims, unless otherwise noted. The terms "couple," "coupling," "being coupled," "coupled," "coupler," and similar terms are used broadly herein and may include any method or device for fixing, bonding, adhering, fastening, attaching, combining, inserting, forming on or in, communicating with, or otherwise directly or indirectly mechanically, magnetically, electrically, chemically, and operably associated with an intermediate element and one or more members, or may also include, but is not limited to, one member being integrally formed with another member in a unified manner. Coupling may occur in any direction, including rotationally. The terms "including" and "such as" are illustrative rather than restrictive, and the word "may" means "may, but not necessarily," unless stated otherwise. Although any other language is used in the present disclosure, embodiments shown in the figures are given for purposes of illustration and explanation as examples and are not the only embodiments of the subject matter herein.

In order to overcome the defects of the existing technical solutions and improve the sound quality of loudspeakers, the present disclosure proposes a solution for actively detecting signal energy in an input signal and dynamically adjusting equalization based on loudness estimation in a time domain. An adaptive equalization method and system for an audio system provided by the present disclosure enables acoustic engineers to achieve a group of aggressive (for example, large gain factors) equalization when an input signal is low-energy, and to achieve a group of mild (for example, small gain factors) equalization when the input signal is high-energy. Furthermore, the loudspeaker response at a target frequency can be significantly and ideally improved while minimizing dynamic range loss and audio distortion.

Figure 1:
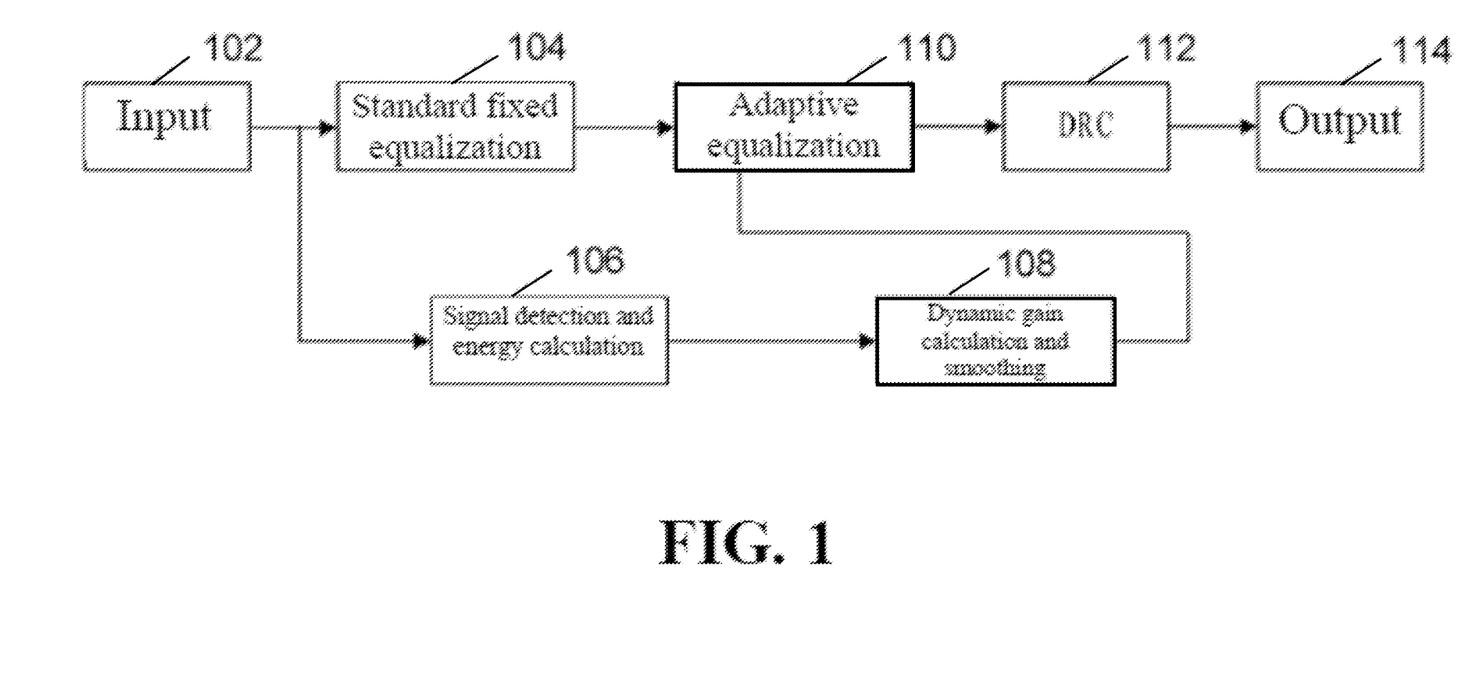
FIG. 1 schematically shows a schematic block diagram of a method and a system according to one or more embodiments of one implementation of the present disclosure.

An adaptive equalization method and system based on dynamic energy according to various embodiments of implementations of the present disclosure will be described in detail below with reference to the accompanying drawings. FIG. 1 shows a schematic block diagram of the principle of a method and a system according to one or more embodiments of one implementation of the present disclosure. For ease of understanding, the present disclosure is described by dividing the main processing procedures of the present method and system into a plurality of modules. It can be understood by those skilled in the art that the description made by using modules is for the purpose of describing the present solution more clearly, but not for the purpose of limitation.

FIG. 1 shows a schematic diagram according to one or more embodiments of one implementation of the present disclosure. In one or more embodiments shown in FIG. 1, the method and system for processing signals in an audio system may mainly include the following parts: input module 102, standard fixed equalization module 104, signal detection and energy calculation module 106, dynamic gain calculation and smoothing module 108, adaptive equalization module 110, DRC module 112, and output module 114. As can be seen from FIG. 1, two-way processing may be performed on an input signal simultaneously. For example, an input signal received from signal input module 102 may be equalized via standard fixed equalization module 104, may be processed by adaptive equalization module 110 capable of dynamically adjusting equalization parameters, and may then reach output module 114 via DRC 112. Meanwhile, at signal detection and energy calculation module 106, the input signal received from input module 102 is detected and signal energy is calculated. Based on the calculated signal energy, dynamic gain calculation and smoothing module 108 may calculate a dynamic gain. Based on the calculated dynamic gain, parameters of adaptive equalization module 110 are dynamically adjusted. In some examples, dynamic gain calculation and smoothing module 108 may calculate the dynamic gain based on the calculated signal energy, and the module may further smooth the calculated dynamic gain. Then, the smoothed gain is used to dynamically adjust the parameters of adaptive equalization module 110.

Figure 2:
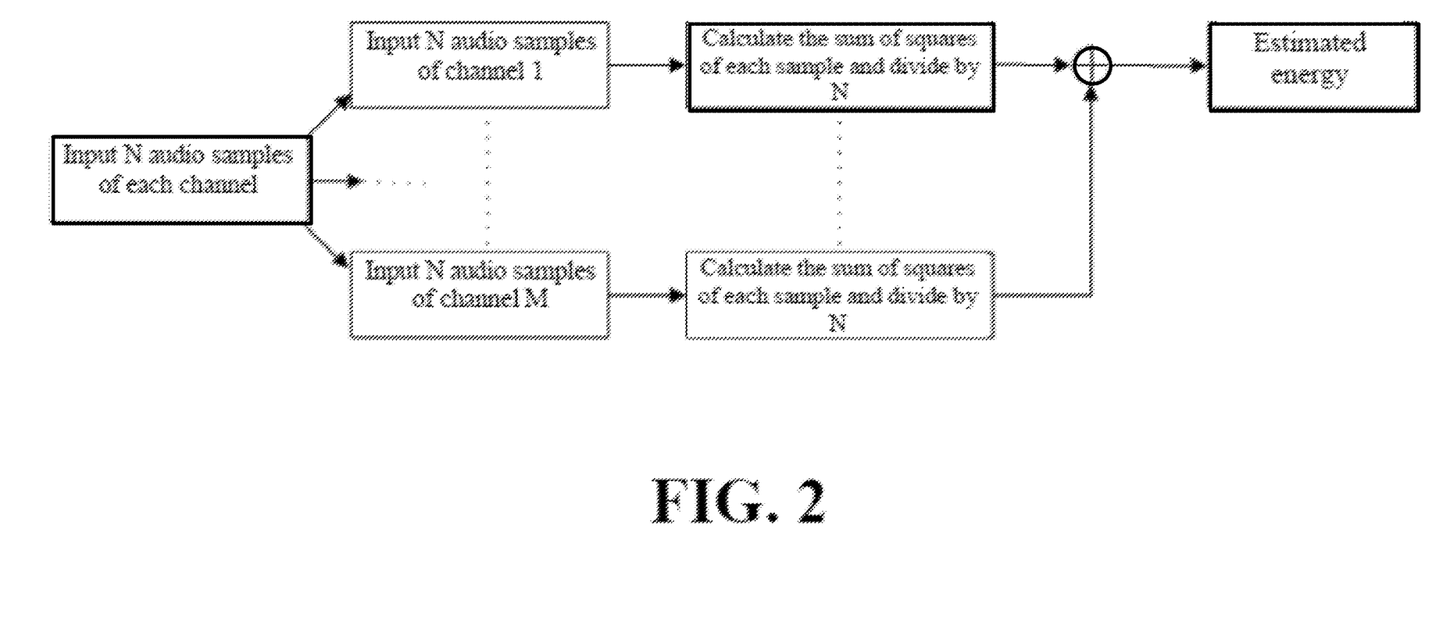
FIG. 2 exemplarily shows a schematic block diagram of the principle of a signal energy calculation method according to one or more embodiments of the present disclosure.

FIG. 2 shows a schematic block diagram of the principle of a signal energy calculation method according to one or more embodiments of the present disclosure. FIG. 2 shows energy calculation performed on M input source channels in an audio system, where the size of a signal frame may be set to N. Both M and N may be selected according to actual system requirements. As shown in FIG. 2, for example, energy calculation is performed on audio sample inputs of M channels respectively, and then the calculated results of the M channels are summed to obtain estimated energy. For each channel, signal energy of the channel is calculated, for example, by calculating the sum of squares of signal amplitudes for each sample in each frame of signal (for example, the size of a frame is N) and dividing by N. The signal energy of all channels is then summed to obtain final estimated signal energy.

Figure 3:
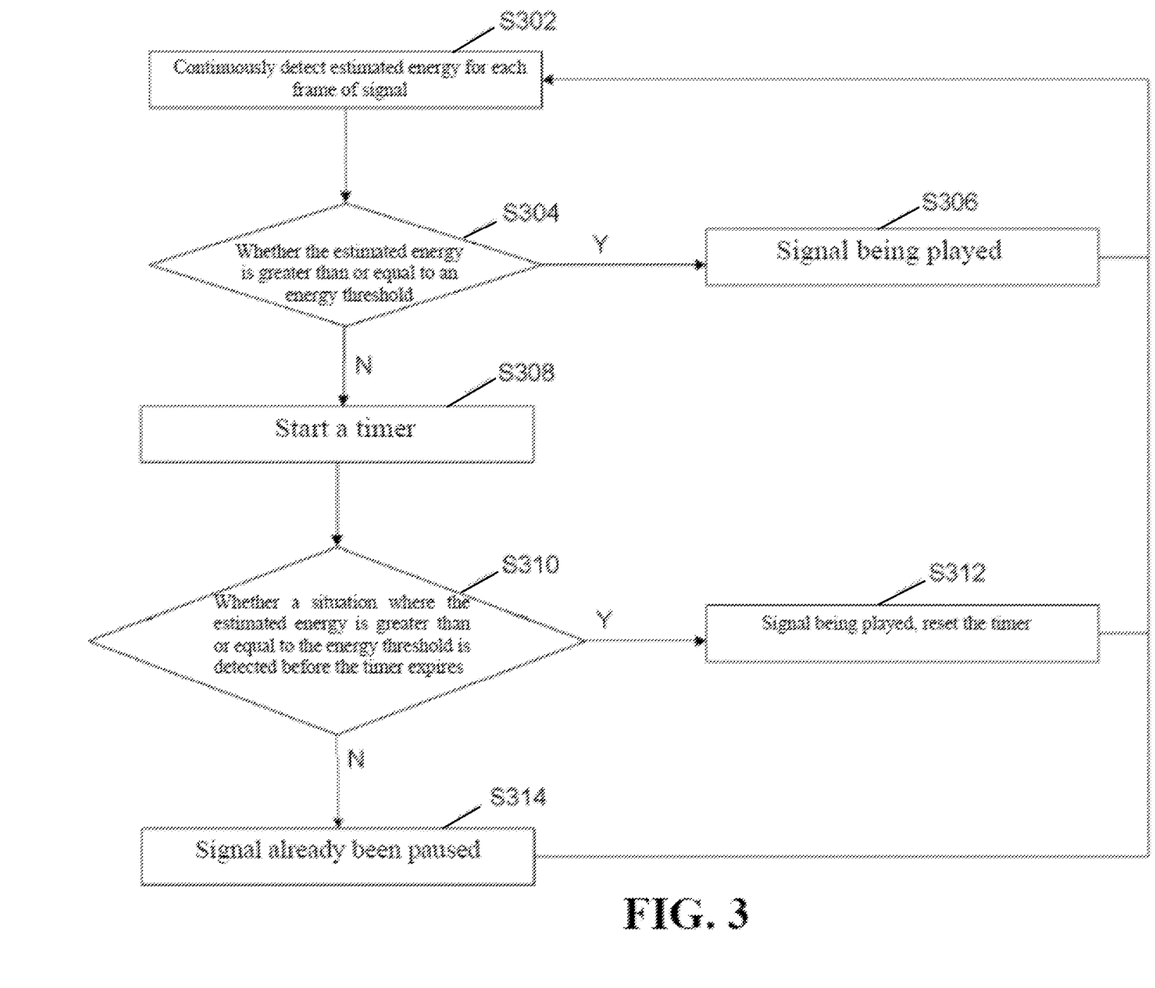
FIG. 3 exemplarily shows a schematic diagram of a method for detecting a signal status based on signal energy estimation according to one or more embodiments of the present disclosure.

FIG. 3 exemplarily shows a schematic diagram of a method for detecting a signal status based on signal energy estimation in one or more embodiments of the present disclosure. For example, at S302, the estimated signal energy for each frame of input signal is continuously detected. Next, at S304, the estimated signal energy is compared with an energy threshold. At S306, if the estimated signal energy is greater than or equal to the energy threshold, the audio signal status is determined to be audio signal being played. If the estimated signal energy is less than the energy threshold, it means that the signal may be paused at this moment, or a small signal may appear when the signal is playing. In this case, in order to avoid falsely determining the occurrence of a low-energy small signal during signal playing as signal pause, a further fine determination is required. At S308, a timer is started. Signal detection is continued, and at S310, it is determined whether a situation where the estimated signal energy is greater than or equal to the energy threshold is detected again before the timer expires. If it is detected that signal energy estimated at a certain time is greater than or equal to the energy threshold before timing is completed, the audio signal status is determined to be audio signal being played at S312, the timer is reset, and signal detection is continued. If the estimated signal energy is always lower than the energy threshold from the time when the timer is started to the time when the timing is completed, it is considered that the audio signal has already been paused at S314. The signal detection is continued. Through the above method, an audio signal status can be determined more accurately.

Figure 4:
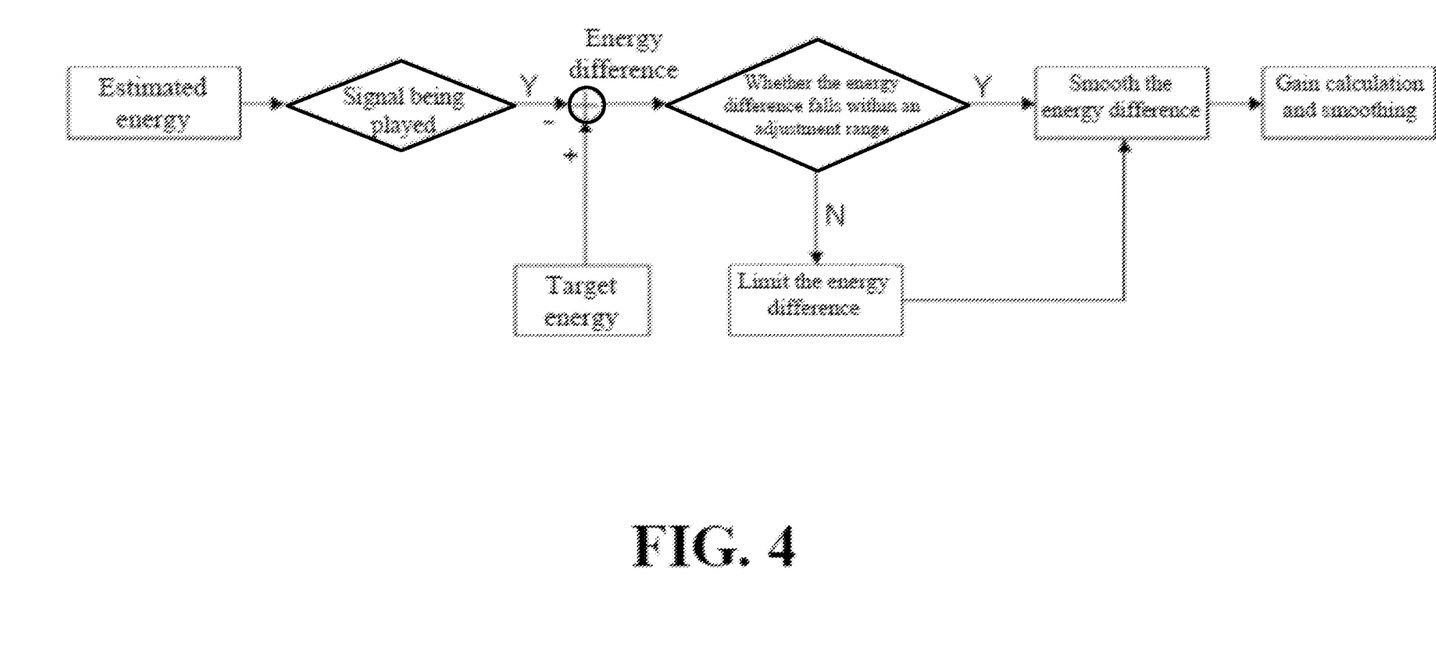
FIG. 4 exemplarily shows a schematic diagram of a method for performing dynamic gain calculation based on estimated signal energy and further smoothing the calculated gain according to one or more embodiments of the present disclosure.

FIG. 4 shows a schematic diagram of a method for performing dynamic gain calculation based on estimated signal energy and further smoothing a calculated gain according to one or more embodiments of the present disclosure. When performing the dynamic gain calculation, the determination result of the audio signal status as shown in FIG. 3 needs to be considered. If the audio signal status is determined to be audio signal already been paused, the dynamic gain calculation is not performed. Instead, parameters used for the dynamic gain calculation and smoothing are frozen, and when it is detected that playing of the audio signal starts, the parameters used for dynamic gain calculation and smoothing are initialized. If the audio signal status is determined to be audio signal being played, the dynamic gain calculation is performed.

As shown in FIG. 4, in a case where the audio signal status is determined to be audio signal being played, a signal energy difference between the estimated signal energy and target energy is calculated. The signal energy difference may indicate whether the signal energy is increasing, decreasing, or fluctuating slightly at a stable level. For example, the signal energy difference may be in the form of a Decibel (dB) difference, and the decibel difference may be smoothed and calculated for use in the dynamic gain calculation. This smoothing is performed in a dB domain rather than a linear domain since the influence of smoothing will not be too strong in this case. In addition, smoothing parameters may also be changed according to the playing time of the audio signal. The signal energy may rapidly increase or decrease after the signal pause. According to the smoothing solution of the present disclosure, as the signal is continuously played, the energy difference will not be smoothed and adjusted immediately according to the signal change, thus allowing some fluctuation changes without introducing distortion. Thus, a better listening experience can be brought to listeners. A further detailed description is made below with reference to FIG. 4.

In some examples, after obtaining an energy difference between the estimated energy and the target energy, it is determined whether the signal energy difference falls within an adjustment range. The adjustment range may be pre-set according to system requirements and actual experience, for example, in units of dB. If the signal energy difference falls within the adjustment range, the signal energy difference is smoothed. Then, gain calculation is performed based on the smoothed energy difference.

If the signal energy difference does not fall within the adjustment range, the signal energy difference is first limited. Then, the limited signal energy difference is smoothed. This method of introducing limiting processing can avoid bringing abrupt listening experience to listeners due to too strong adjustment caused by an excessively large signal energy difference. Next, the dynamic gain calculation is performed based on the smoothed signal energy difference.

In some examples, the calculated gain may also be further smoothed. For example, the calculated gain is further smoothed by ramp-up from the current gain to the calculated gain over a sample block including a plurality of samples. This can ensure that there will no no sudden jump in gain in the output.

Figure 5:
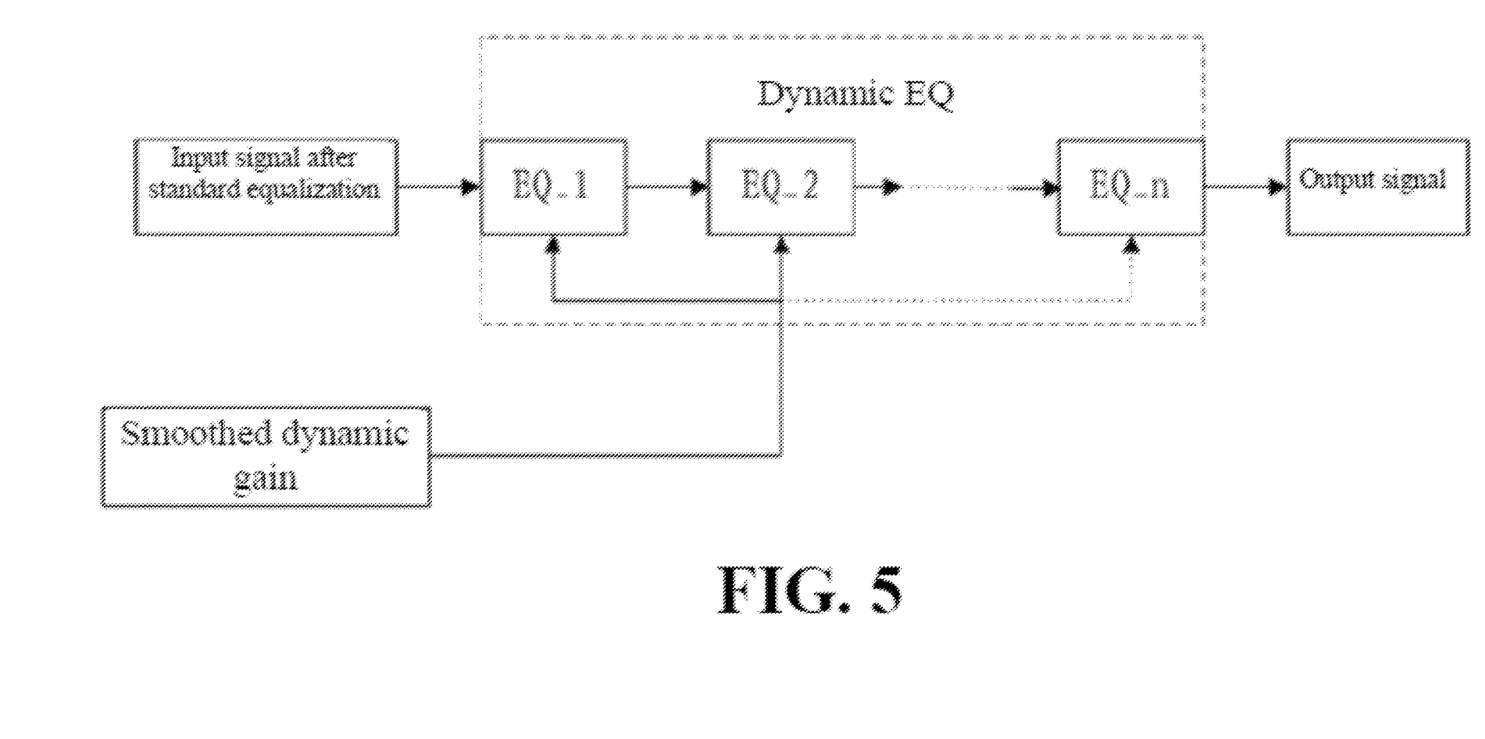
FIG. 5 schematically shows a schematic diagram of a method for performing dynamic equalization adjustment based on a calculated and smoothed gain according to one or more embodiments of the present disclosure.

FIG. 5 schematically shows a schematic diagram of a method for performing dynamic equalization adjustment based on a calculated and smoothed dynamic gain according to one or more embodiments of the present disclosure. The smoothed dynamic gain may be used in a dynamic equalization module, so that dynamic equalization processing can be performed on an input signal. For example, the dynamic equalization (EQ) module may include several EQ filters implemented through software or hardware. A center frequency of each band and an effective bandwidth of each band in these EQ filters can be selected and designed based on the maximum performance of a loudspeaker and a tuning direction of an acoustic engineer. Meanwhile, the gain factor for each band may be calculated by means of different functions based on the smoothed dynamic gain.

For example, a calculated dynamic gain G may be applied to three dynamic equalization bands. The center frequency of each band is set to, for example, 50 Hz, 1 kHz, and 10 kHz, and the effective bandwidth is, for example, 10 Hz, 100 Hz, and 2 kHz, respectively. The gain factors may then be selected to be $F_1(G)$, $F_2(G)$, and $F_3(G)$, respectively, where Fe) is different functions of the gain G, which may be linear or non-linear. Those skilled in the art can understand that the above examples are only to illustrate the present solution more clearly, and do not specifically limit the number of bands and the number of EQ filters. EQs of a plurality of bands may be designed according to actual requirements, for example, EQ_1, EQ_2, ..., EQ_n.

Figure 6:
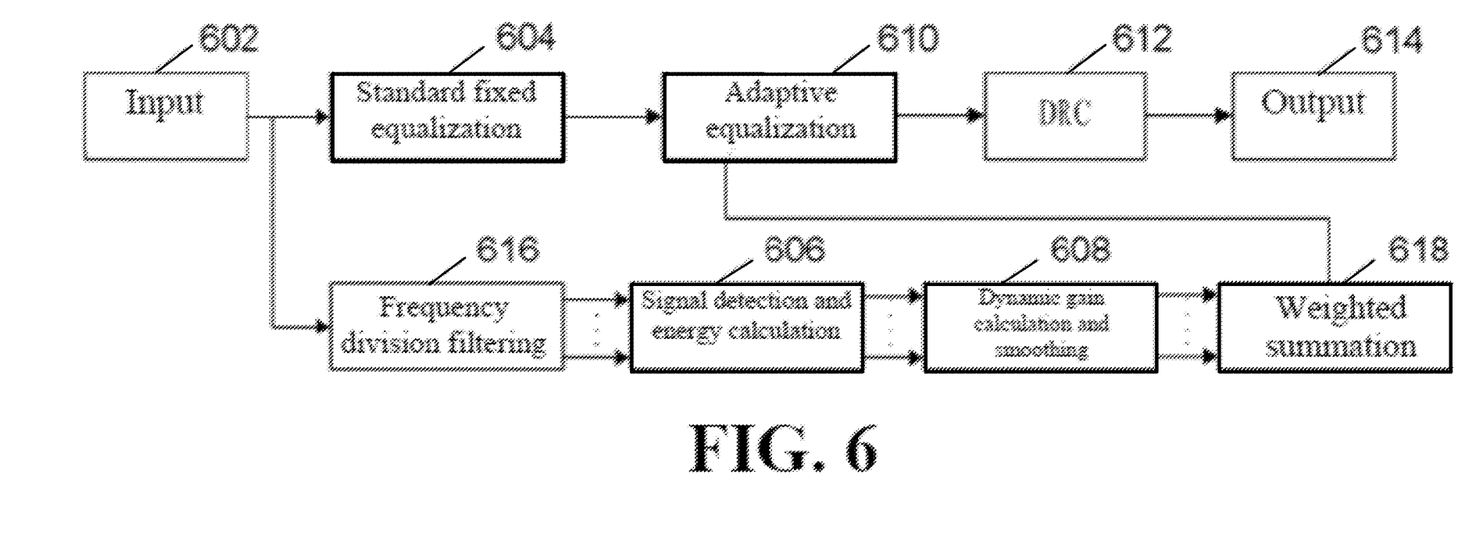
FIG. 6 schematically shows a schematic block diagram of a method and a system according to one or more embodiments of another implementation of the present disclosure.

FIG. 6 shows a schematic diagram of a method and a system according to one or more embodiments of another implementation of the present disclosure. In one or more embodiments shown in FIG. 6, the method and system for processing signals in an audio system may mainly include the following parts: signal input module 602, standard fixed equalization module 604, signal detection and energy calculation module 606, dynamic gain calculation and smoothing module 608, adaptive equalization module 610, DRC module 612, and output module 614. The working principle of these modules is substantially the same as that of the modules shown in FIG. 1. Besides, the method and system shown in FIG. 6 may further include frequency division filtering module 616 and weighted summation module 618.

As can be seen from FIG. 6, two-way processing may be performed on an input signal simultaneously. For example, an input signal received from signal input module 602 may be equalized via standard fixed equalization module 604, may be processed by adaptive equalization module 610 capable of dynamically adjusting equalization parameters, and may then reach output module 614 via DRC 612. Meanwhile, at frequency division filtering module 616, frequency division filtering may be performed on the input signal. Considering the capabilities and limitations of a loudspeaker, several filter banks implemented through hardware or software may be used in frequency division filtering module 616 for different frequency ranges. For example, three filter banks may be used for low, medium, and high frequency ranges, respectively. Therefore, the signal detection and energy calculation as well as the dynamic gain calculation and smoothing processing, which are to be performed next, may be performed separately in different frequency ranges, respectively.

At signal detection and energy calculation module 606, the input signal, after the frequency division filtering, received from frequency division filtering module 616 is detected and the signal energy is calculated. Based on the calculated signal energy, dynamic gain calculation and smoothing module 608 may calculate a dynamic gain. The signal processing performed at signal detection and energy calculation module 606 and dynamic gain calculation and smoothing module 608 is the same as that performed at signal detection and energy calculation module 106 and dynamic gain calculation and smoothing module 108 in FIG. 1. Refer to FIGS. 2-4 and the above related description for the specific processing method.

At weighted summation module 618, the calculated and smoothed gains may be subjected to weighted summation processing according to different frequency ranges, wherein weights used for the weighted summation processing are set according to the different frequency ranges. Next, adaptive equalization module 610 is dynamically adjusted based on the dynamic gain after the weighted summation processing. Description will be made below with reference to FIG. 7.

Figure 7:
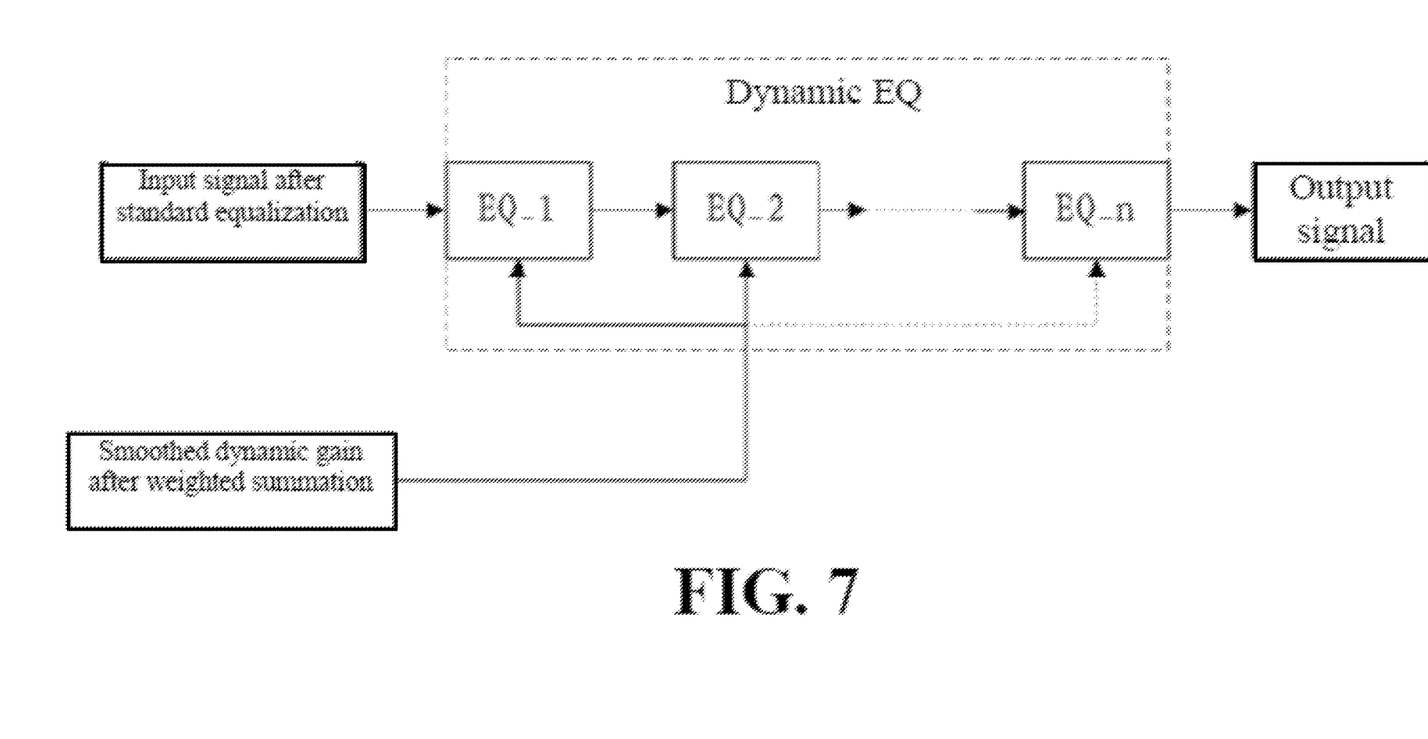
FIG. 7 schematically shows a schematic diagram of a method for performing dynamic equalization adjustment based on a gain after weighted summation according to one or more embodiments of the present disclosure.

FIG. 7 schematically shows a schematic diagram of a method for performing dynamic equalization adjustment based on a dynamic gain after weighted summation according to one or more embodiments of the present disclosure. The dynamic gain after weighted summation may be used in a dynamic equalization module, so that dynamic equalization processing can be performed on an input signal. For example, the dynamic equalization (EQ) module may include several EQ filters implemented through software or hardware. A center frequency of each band and an effective bandwidth of each band in these EQ filters can be selected and designed based on the maximum performance of a loudspeaker and a tuning direction of an acoustic engineer. Meanwhile, the gain factor for each band may be calculated by means of different functions based on the smoothed dynamic gain.

For example, a dynamic gain G after weighted summation may be applied to three dynamic equalization bands. The center frequency of each band is set to 50 Hz, 1 kHz, and 10 kHz, and the effective bandwidth is 10 Hz, 100 Hz, and 2 kHz, respectively. The gain factors may then be selected to be $F_1(G)$, $F_2(G)$, and $F_3(G)$, respectively, where $F_i(*)$ is different functions of the gain G, which may be linear or non-linear. Those skilled in the art can understand that the above examples are only to illustrate the present solution more clearly, and do not specifically limit the number of bands and the number of EQ filters. EQs of a plurality of bands may be designed according to actual requirements, for example, EQ_1, EQ_2, ..., EQ_n.

Figure 8:
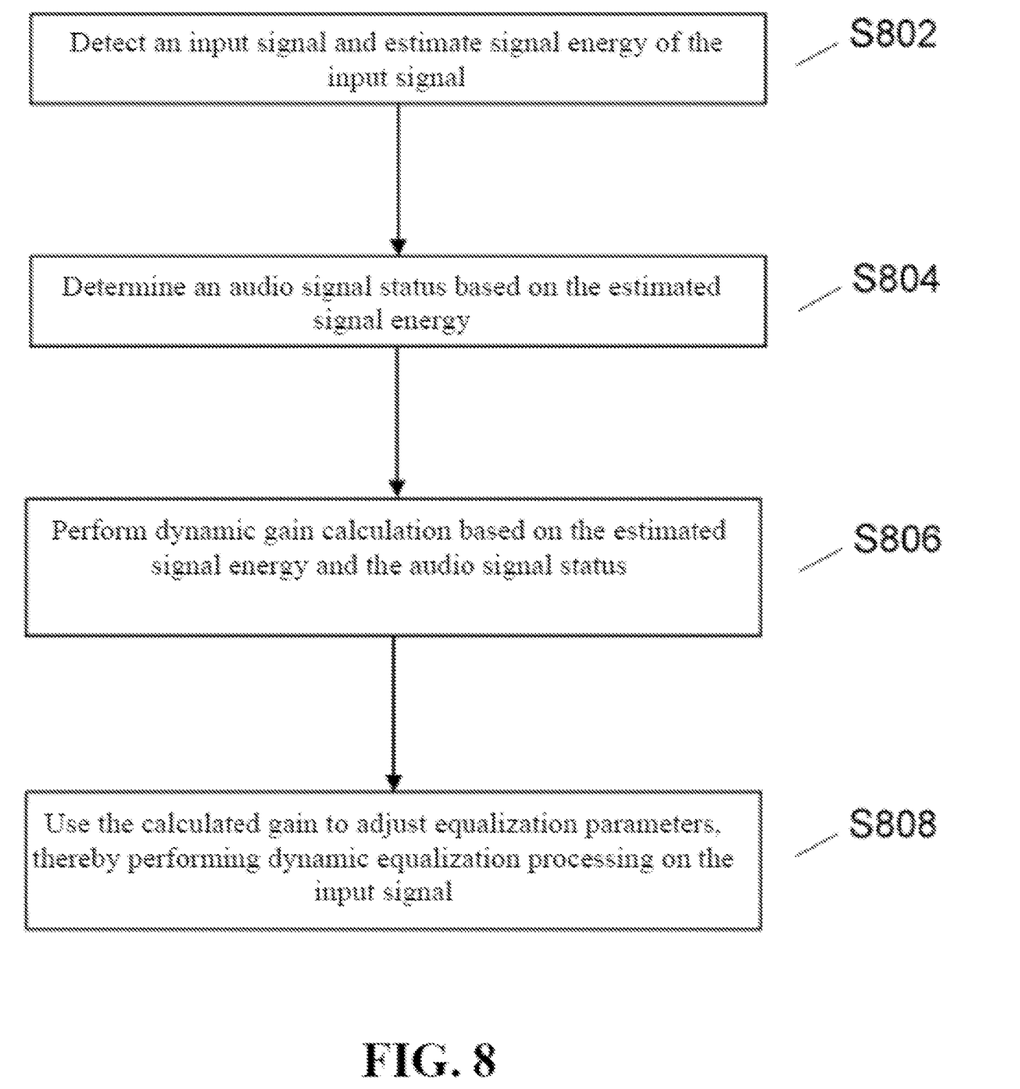
FIG. 8 schematically shows an adaptive equalization method for an audio system according to one or more embodiments of the present disclosure.

FIG. 8 schematically shows an adaptive equalization method for an audio system according to one or more embodiments of the present disclosure. As shown in FIG. 8, at S802, an input signal is detected, and signal energy of the input signal is estimated. At S804, an audio signal status is determined based on the estimated signal energy. At S806, dynamic gain calculation is performed based on the estimated signal energy and the determined audio signal status. At S808, the calculated dynamic gain is used to adjust equalization parameters, thereby performing dynamic equalization processing on the input signal.

The method and system provided by the present disclosure further enhance the performance of a specific acoustic system by applying a dynamic EQ curve to better match the performance of a transducer in the acoustic system with a digitally controlled hardware power amplifier. The solution proposed by the present disclosure can be used for low frequency extension at low volume, loudspeaker protection, and dynamic range preservation at high volume, and has finer control in these aspects than conventional methods.

Clause 1. An adaptive equalization method for an audio system, comprising: detecting an input signal and estimating signal energy of the input signal; determining an audio signal status based on the estimated signal energy; performing dynamic gain calculation based on the estimated signal energy and the audio signal status; and using the calculated dynamic gain to adjust equalization parameters, thereby performing dynamic equalization processing on the input signal.

Clause 2. The method according to clause 1, wherein the determining an audio signal status based on the estimated signal energy comprises: continuously detecting the estimated signal energy for each frame of input signal; comparing the estimated signal energy with an energy threshold; if the estimated signal energy is greater than or equal to the energy threshold, determining the audio signal status to be audio signal being played; or if the estimated signal energy is less than the energy threshold, starting a timer; if it is detected again that the estimated signal energy is greater than or equal to the energy threshold before the timer expires, determining the audio signal status to be audio signal being played; otherwise, determining the audio signal status to be audio signal already been paused.

Clause 3. The method according to any of the preceding clauses, wherein the performing dynamic gain calculation based on the estimated signal energy and the audio signal status comprises: if the audio signal status is determined to be audio signal being played, performing the dynamic gain calculation; or if the audio signal status is determined to be audio signal already been paused, not performing the dynamic gain calculation, and when it is detected that playing of the audio signal starts, initializing parameters used for the dynamic gain calculation.

Clause 4. The method according to any of the preceding clauses, wherein the performing dynamic gain calculation comprises: calculating a signal energy difference between the estimated signal energy and target energy; determining whether the signal energy difference falls within an adjustment range; if the signal energy difference falls within the adjustment range, smoothing the signal energy difference; or if the signal energy difference does not fall within the adjustment range, first limiting the signal energy difference, and then smoothing the limited signal energy difference; and calculating the dynamic gain based on the smoothed signal energy difference.

Clause 5. The method according to any of the preceding clauses, further comprising a charger for charging the battery, wherein the control unit sets different values for charging parameter of the charger based on whether the wearable device is in a power-on charging mode or a power-off charging mode.

Clause 6. The method according to any of the preceding clauses, further comprising smoothing the calculated dynamic gain.

Clause 7. The method according to any of the preceding clauses, further comprising: performing weighted summation processing of the smoothed dynamic gain according to different frequency ranges, wherein weights used for the weighted summation processing are set according to the different frequency ranges.

Clause 8. The method according to any of the preceding clauses, further comprising: calculating gain factors for equalization of different bands based on the dynamic gain after the weighted summation processing, thereby performing dynamic equalization processing on the input signal.

Clause 9. The method according to any of the preceding clauses, wherein calculating the gain factors comprises: calculating the gain factors using gain functions corresponding to different bands.

Clause 10. An adaptive equalization system for an audio system, comprising: a memory configured to store computer-executable instructions; and a processor configured to execute the computer-executable instructions to implement the method according to any of the preceding clauses 1-9.

The description of the implementations has been presented for the purposes of illustration and description. The implementations may be appropriately modified and changed according to the above description or these modifications and changes may be obtained by practicing the method. For example, unless otherwise indicated, one or more of the methods described may be performed by a suitable device and/or a combination of devices. The method may be performed by using one or more logic devices (for example, processors) in combination with one or more additional hardware elements (such as storage devices, memories, hardware network interfaces/antennas, switches, actuators, clock circuits, etc.) to perform stored instructions. The method described and associated actions may also be executed in parallel and/or simultaneously in various orders other than the order described in this application. The system described is illustrative in nature, and may include additional elements and/or omit elements. The subject matter of the present disclosure includes all novel and non-obvious combinations of the disclosed various systems and configurations as well as other features, functions, and/or properties.

The system may include additional or different logic, and may be implemented in many different ways. The processor may be implemented as a microprocessor, a microcontroller, an Application Specific Integrated Circuit (ASIC), discrete logic, or a combination of these and/or other types of circuits or logic. Similarly, the memory may be a DRAM, a SRAM, a flash memory, or other types of memories. Parameters (for example, conditions and thresholds) and other data structures may be stored and managed separately, may be combined into a single memory or database, or may be logically and physically organized in many different ways. Programs and instruction sets may be parts of a single program, or separate programs, or distributed across a plurality of memories and processors.

As used in this application, an element or step listed in the singular form and preceded by the word "one/a" should be understood as not excluding a plurality of said elements or steps, unless such exclusion is indicated. Furthermore, references to "one implementation" or "one example" of the present disclosure are not intended to be interpreted as excluding the existence of additional implementations that also incorporate the recited features. The present invention has been described above with reference to specific implementations. However, those of ordinary skill in the art will appreciate that various modifications and changes may be made therein without departing from the broader spirit and scope of the present invention as set forth in the appended claims.

What is claimed is:

1. An adaptive equalization method for an audio system, comprising:
    detecting an input signal;
    estimating signal energy of the input signal;
    determining an audio signal status based on the estimated signal energy;
    performing a dynamic gain calculation based on the estimated signal energy and the audio signal status to determine a calculated dynamic gain; and
    using the calculated dynamic gain to adjust equalization parameters, thereby performing dynamic equalization processing on the input signal.

2. The method according to claim 1, further comprising: performing frequency division filtering on the input signal before estimating the signal energy of the input signal.

3. The method according to claim 1, wherein determining the audio signal status based on the estimated signal energy comprises:
    continuously detecting the estimated signal energy for each frame of input signal;
    comparing the estimated signal energy with an energy threshold;
    if the estimated signal energy is greater than or equal to the energy threshold, determining the audio signal status to be audio signal being played; or
    if the estimated signal energy is less than the energy threshold:
        starting a timer;
        if it is detected again that the estimated signal energy is greater than or equal to the energy threshold before the timer expires, determining the audio signal status to be audio signal being played; and
        otherwise, determining the audio signal status to be audio signal already been paused.

4. The method according to claim 3, wherein performing the dynamic gain calculation based on the estimated signal energy and the audio signal status comprises:

if the audio signal status is determined to be audio signal being played, performing the dynamic gain calculation; or if the audio signal status is determined to be audio signal already been paused, not performing the dynamic gain calculation, and when it is detected that playing of the audio signal starts, initializing parameters used for the dynamic gain calculation.

5. The method according to claim 4, wherein performing the dynamic gain calculation comprises:

calculating a signal energy difference between the estimated signal energy and target energy;

determining whether the signal energy difference falls within an adjustment range;

if the signal energy difference falls within the adjustment range, smoothing the signal energy difference; or if the signal energy difference does not fall within the adjustment range, first limiting the signal energy difference, and then smoothing the limited signal energy difference; and calculating the dynamic gain based on the smoothed signal energy difference.

6. The method according to claim 5, further comprising: smoothing the calculated dynamic gain.

7. The method according to claim 6, further comprising: performing weighted summation processing of the smoothed dynamic gain according to different frequency ranges, wherein weights used for the weighted summation processing are set according to the different frequency ranges.

8. The method according to claim 7, further comprising: calculating gain factors for equalization of different bands based on the dynamic gain after the weighted summation processing, thereby performing dynamic equalization processing on the input signal.

9. The method according to claim 8, wherein calculating the gain factors comprises:

calculating the gain factors using gain functions corresponding to different bands.

10. An adaptive equalization system for an audio system, the adaptive equalization system comprising:

a memory configured to store computer-executable instructions; and a processor that, when executing the computer-executable instructions, is configured to perform the steps of:

detecting an input signal;

estimating signal energy of the input signal;

determining an audio signal status based on the estimated signal energy;

performing a dynamic gain calculation based on the estimated signal energy and the audio signal status to determine a calculated dynamic gain; and using the calculated dynamic gain to adjust equalization parameters, thereby performing dynamic equalization processing on the input signal.

11. The adaptive equalization system according to claim 10, wherein the steps further comprise:

performing frequency division filtering on the input signal before estimating the signal energy of the input signal.

12. The adaptive equalization system according to claim 10, wherein determining the audio signal status based on the estimated signal energy comprises:

continuously detecting the estimated signal energy for each frame of input signal;

comparing the estimated signal energy with an energy threshold;

if the estimated signal energy is greater than or equal to the energy threshold, determining the audio signal status to be audio signal being played; or if the estimated signal energy is less than the energy threshold:

starting a timer;

if it is detected again that the estimated signal energy is greater than or equal to the energy threshold before the timer expires, determining the audio signal status to be audio signal being played; and otherwise, determining the audio signal status to be audio signal already been paused.

13. The adaptive equalization system according to claim 12, wherein performing the dynamic gain calculation based on the estimated signal energy and the audio signal status comprises:

if the audio signal status is determined to be audio signal being played, performing the dynamic gain calculation; or if the audio signal status is determined to be audio signal already been paused, not performing the dynamic gain calculation, and when it is detected that playing of the audio signal starts, initializing parameters used for the dynamic gain calculation.

14. The adaptive equalization system according to claim 13, wherein performing the dynamic gain calculation comprises:

calculating a signal energy difference between the estimated signal energy and target energy;

determining whether the signal energy difference falls within an adjustment range;

if the signal energy difference falls within the adjustment range, smoothing the signal energy difference; or if the signal energy difference does not fall within the adjustment range, first limiting the signal energy difference, and then smoothing the limited signal energy difference; and calculating the dynamic gain based on the smoothed signal energy difference.

15. The adaptive equalization system according to claim 14, wherein the steps further comprise:

smoothing the calculated dynamic gain.

16. The adaptive equalization system according to claim 15, wherein the steps further comprise:

performing weighted summation processing of the smoothed dynamic gain according to different frequency ranges, wherein weights used for the weighted summation processing are set according to the different frequency ranges.

17. The adaptive equalization system according to claim 16, wherein the steps further comprise:

calculating gain factors for equalization of different bands based on the dynamic gain after the weighted summation processing, thereby performing dynamic equalization processing on the input signal.

18. The adaptive equalization system according to claim 17, wherein calculating the gain factors comprises: calculating the gain factors using gain functions corresponding to different bands.

* * * * *